United States Patent
Kawashima et al.

(10) Patent No.: US 9,252,608 B2
(45) Date of Patent: Feb. 2, 2016

(54) ELECTRICAL STORAGE SYSTEM, AND CONTROL METHOD FOR ELECTRICAL STORAGE SYSTEM

(71) Applicants: Hironobu Kawashima, Toyota (JP); Yukinari Tanabe, Nagoya (JP)

(72) Inventors: Hironobu Kawashima, Toyota (JP); Yukinari Tanabe, Nagoya (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 276 days.

(21) Appl. No.: 14/059,854

(22) Filed: Oct. 22, 2013

(65) Prior Publication Data
US 2014/0111122 A1 Apr. 24, 2014

(30) Foreign Application Priority Data
Oct. 22, 2012 (JP) ................................ 2012-232926

(51) Int. Cl.
*H02P 1/00* (2006.01)
*H02J 7/00* (2006.01)
*B60L 3/00* (2006.01)
*G01R 31/36* (2006.01)

(52) U.S. Cl.
CPC .............. *H02J 7/0029* (2013.01); *B60L 3/00* (2013.01); *H02J 7/0013* (2013.01); *H02J 7/0026* (2013.01); *H02J 7/0063* (2013.01); *G01R 31/362* (2013.01); *G01R 31/3658* (2013.01); *H02J 2007/004* (2013.01); *H02J 2007/0039* (2013.01); *H02J 2007/0067* (2013.01); *Y02T 10/7005* (2013.01)

(58) Field of Classification Search
CPC ..... H02J 7/0026; H02J 7/0029; H02J 7/0013; B60L 3/00
USPC ..................... 318/139; 320/118, 119, 134
See application file for complete search history.

(56) References Cited

U.S. PATENT DOCUMENTS

| | | | | |
|---|---|---|---|---|
| 5,619,107 A | * | 4/1997 | Shinohara | B60L 3/00 307/10.7 |
| 2007/0120529 A1 | * | 5/2007 | Ishikawa | H02J 7/0018 320/119 |
| 2008/0211459 A1 | * | 9/2008 | Choi | B60L 3/0046 320/134 |
| 2012/0025769 A1 | * | 2/2012 | Kikuchi | B60L 3/0046 320/118 |
| 2012/0313584 A1 | * | 12/2012 | Sugiyama | B60L 11/123 320/119 |
| 2013/0069596 A1 | * | 3/2013 | Ochiai | B60L 3/0046 320/118 |
| 2014/0203735 A1 | * | 7/2014 | Sugiyama | H02J 1/00 318/139 |

FOREIGN PATENT DOCUMENTS

| | | |
|---|---|---|
| JP | 2009-092465 A | 4/2009 |
| JP | 2011-072096 | 4/2011 |
| JP | 2012-055049 | 3/2012 |

* cited by examiner

*Primary Examiner* — Eduardo Colon Santana
*Assistant Examiner* — Gabriel Agared
(74) *Attorney, Agent, or Firm* — Sughrue Mion, PLLC

(57) ABSTRACT

A first electrical storage stack is connected in series with a second electrical storage stack. A current interrupter is configured to interrupt a current path by being removed from the current path. First and second detection line are respectively connected to first and second terminals of the first electrical storage stack. The second electrical storage stack is connected to the second terminal of the first electrical storage stack via the current interrupter. A third detection line is connected to a portion of the current path, located on the second electrical storage stack side of the current interrupter. A controller is configured to control charging and discharging operations of each of the first and second electrical storage stacks on the basis of the voltage of the first electrical storage stack, the voltage being detected via the first detection line and the third detection line.

11 Claims, 3 Drawing Sheets

ELECTRICAL STORAGE SYSTEM, AND CONTROL METHOD FOR ELECTRICAL STORAGE SYSTEM

INCORPORATION BY REFERENCE

The disclosure of Japanese Patent Application No. 2012-232926 filed on Oct. 22, 2012 including the specification, drawings and abstract is incorporated herein by reference in its entirety.

BACKGROUND OF THE INVENTION

1. Field of the Invention

The invention relates to an electrical storage system including a current interrupter between electrical storage stacks, and a control method for the electrical storage system.

2. Description of Related Art

In a battery system in which a plurality of battery stacks are serially connected, a current interrupter that interrupts a current path between the battery stacks may be provided so as to be insertable and removable. By removing the current interrupter, it is possible to improve safety of work for, for example, assembling or replacing the battery stacks.

However, when the battery system is started up in a state where the current interrupter is not inserted after, for example, assembling or replacing the battery stacks, an overvoltage may be applied to the battery stacks at an interrupted location in the current path due to removal of the current interrupter or an overcurrent (battery current) may flow into a device connected to the battery stacks. When an overvoltage is applied to the battery stacks or an overcurrent flows into the battery stacks, the performance of the device connected to the battery stacks may decrease.

SUMMARY OF THE INVENTION

The invention provides an electrical storage system and a control method for an electrical storage system, which suppress charging and discharging operations in a state where a current interrupter provided in a current path between serially connected electrical storage stacks is not inserted.

A first aspect of the invention provides an electrical storage system configured to supply electric power to a drive motor for a vehicle. The electrical storage system includes a first electrical storage stack, a second electrical storage stack, a voltage monitoring unit, a current interrupter and a controller. The first electrical storage stack is constituted by a plurality of electrical storage elements. The second electrical storage stack is constituted by a plurality of electrical storage elements, and is connected in series with the first electrical storage stack. The voltage monitoring unit includes a plurality of detection lines, and the voltage monitoring unit is configured to receive potentials of both positive and negative electrode terminals of each of the first and second electrical storage stacks via the detection lines and detect voltages of the first and second electrical storage stacks. The current interrupter is detachably provided in a current path between the first and second electrical storage stacks, and is configured to interrupt the current path by being removed from the current path. The controller is configured to control charging and discharging operations of each of the first and second electrical storage stacks. The detection lines include a first detection line, a second detection line and a third detection line. The first detection line is connected to a first terminal of the first electrical storage stack. The second detection line is connected to a second terminal of the first electrical storage stack. The second electrical storage stack is connected to the second terminal of the first electrical storage stack via the current interrupter. The third detection line is connected to a portion of the current path, located on the second electrical storage stack side of the current interrupter. The controller is configured to control charging and discharging operations of each of the first and second electrical storage stacks on the basis of the voltage of the first electrical storage stack, which is detected via the first detection line and the third detection line.

According to the first aspect of the invention, through voltage detection of the electrical storage stack via the current interrupter, it is possible to detect whether the current interrupter is connected, and the charging and discharging operations of each of the electrical storage stacks are controlled on the basis of whether the current interrupter is connected. Therefore, it is possible not to allow the charging and discharging operations of each of the electrical storage system in a state where the current interrupter provided in the current path between the electrical storage stacks is not inserted, so it is possible to prevent, for example, a decrease in the performance of the electrical storage stacks.

The voltage monitoring unit may further include a capacitor and a voltage detection unit. The capacitor may be connected between the detection lines, and may be configured to be charged on the basis of a voltage between the detection lines. The voltage detection unit may be connected between both electrodes of the capacitor, and may be configured to detect a voltage of the capacitor. The third detection line may be connected to one of the electrodes of the capacitor, to which the second detection line is connected.

The detection lines may further include a fourth detection line and a fifth detection line. The fourth detection line may be connected to a first terminal of the second electrical storage stack. The fifth detection line may be connected to a second terminal of the second electrical storage stack. One end of the third detection line may be connected to the fourth detection line, and the other end of the third detection line may be connected to the capacitor. The third detection line may be a detection line branched off from the fourth detection line. With this configuration, it is possible to easily add the configuration of detecting whether the current interrupter is connected to the voltage monitoring unit that detects the voltages of the electrical storage stacks. Therefore, it is possible to simplify the voltage monitoring unit and to reduce cost.

The voltage monitoring unit may further include a plurality of switches respectively provided in the detection lines. The controller may be configured not to carry out charging and discharging operations of each of the first and second electrical storage stacks when the voltage of the first electrical storage stack, which is detected at the time when the switch in the first detection line and the switch in the third detection line are turned on, is 0.

The electrical storage system may further include a system main relay configured to allow connection between the drive motor and one of the first electrical storage stack and the second electrical storage stack. In this case, the voltage monitoring unit may be configured to detect the voltage of the first electrical storage stack via the first detection line and the third detection line before the system main relay is turned on when an ignition switch is turned on to start up the electrical storage system. The controller may be configured to restrict switching of the system main relay from an off state to an on state.

A second aspect of the invention provides a control method for an electrical storage system including a first electrical storage stack of which a first terminal and a second terminal are respectively connected to a first detection line and a second detection line; a second electrical storage stack connected in series with the first electrical storage stack at the second terminal via a current interrupter; and the current interrupter configured to interrupt a current path between the first electrical storage stack and the second electrical storage stack by being removed from the current path, the electrical storage system being configured to supply electric power to a drive motor for a vehicle. The control method includes: detecting a voltage of the first electrical storage stack via the first detection line and a third detection line connected to a portion of the current path, located on the second electrical storage stack side of the current interrupter; and controlling charging and discharging operations of each of the first and second electrical storage stacks on the basis of the detected voltage of the first electrical storage stack. According to the second aspect as well, similar advantageous effects to those of the first aspect are obtained.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an embodiment of the invention will be described. In the following description, "restrict" includes the meaning of "prohibit".

First Embodiment

Figure 1:
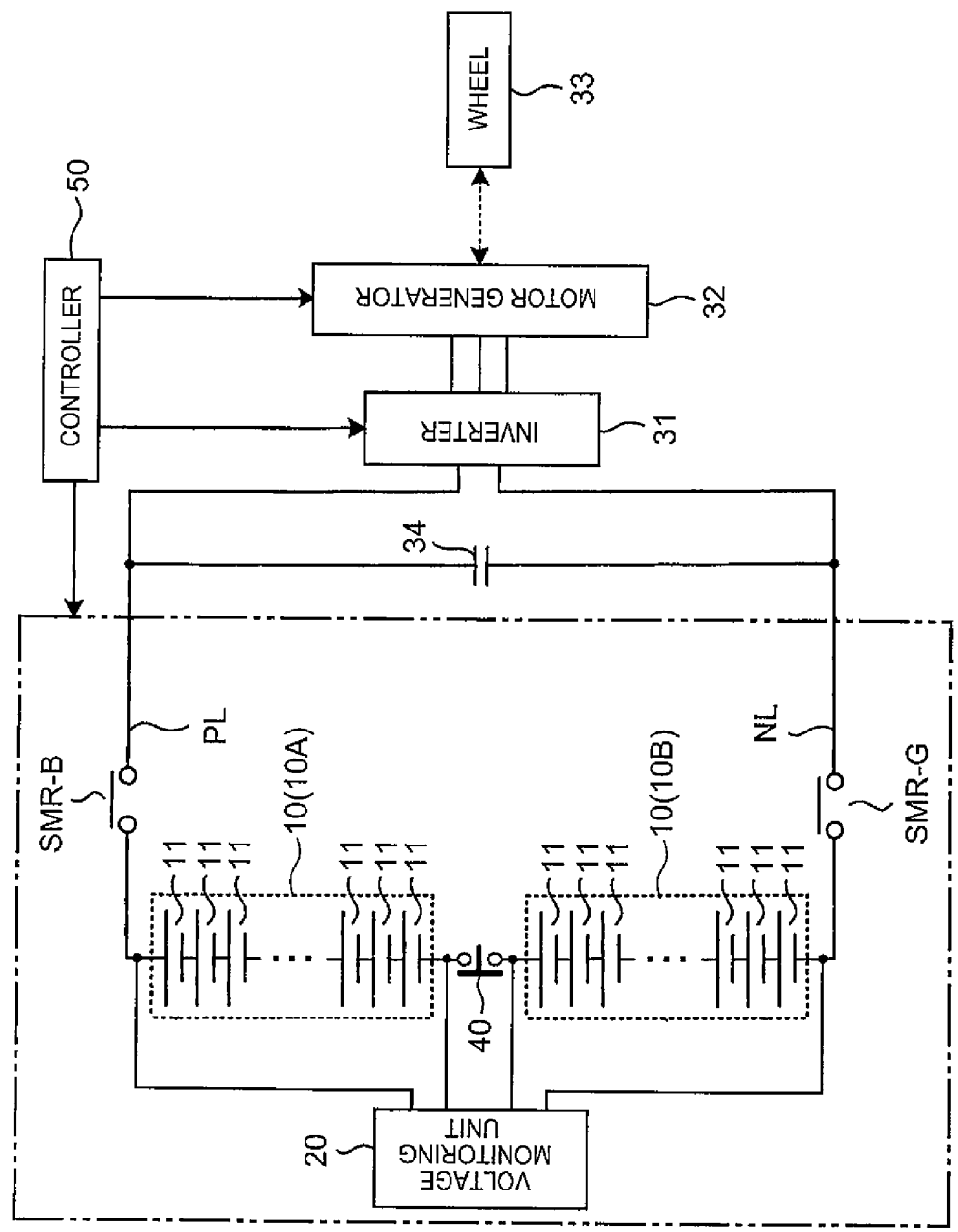
FIG. 1 is a view that shows the configuration of a battery system mounted on a vehicle according to a first embodiment.

A battery system (which corresponding to an electrical storage system) according to the present embodiment will be described with reference to FIG. 1. FIG. 1 is a schematic view that shows the configuration of the battery system. The battery system according to the present embodiment is mounted on a vehicle. The vehicle is an electric vehicle or a hybrid vehicle. In the present embodiment, a hybrid vehicle is described as an example; however, for example, the vehicle may be an electric vehicle that includes only a battery system (power supply device) as a power source for propelling the vehicle.

The battery system includes a power supply device 10. The power supply device 10 according to the present embodiment is configured to include two battery stacks (which correspond to electrical storage stacks) 10A, 10B. The battery stacks 10A, 10B are serially connected, and are configured as the single power supply device. In the present embodiment, the single power supply device is constituted by the two battery stacks 10A, 10B; however, the configuration of the power supply device is not limited to this configuration. For example, the single power supply device may be constituted by three or more battery stacks.

The positive electrode terminal of the power supply device 10 (the positive electrode terminal of the battery stack 10A) and an inverter 31 are connected to each other via a positive electrode line (cable) PL, and the negative electrode terminal of the power supply device 10 (the negative electrode terminal of the battery stack 10B) and the inverter 31 are connected to each other via a negative electrode line (cable) NL. A system main relay SMR-B is provided in the positive electrode line PL, and a system main relay SMR-G is provided in the negative electrode line NL.

A capacitor 34 connected to the positive electrode line PL and the negative electrode line NL is provided between the system main relays SMR-B, SMR-G and the inverter 31. The capacitor 34 is a smoothing capacitor. The capacitor 34 is charged with electric charge corresponding to an inverter voltage, and smoothes a voltage between the positive electrode line PL and the negative electrode line NL.

The inverter 31 converts direct-current power, supplied from the power supply device 10, to alternating-current power. A motor generator 32 (alternating-current motor) is connected to the inverter 31. The motor generator 32 generates kinetic energy for propelling the vehicle upon reception of the alternating-current power supplied from the inverter 31. The motor generator 32 is connected to a wheel 33. When the vehicle is a hybrid vehicle, an engine (not shown) may be connected to the wheel 33, and kinetic energy generated by the engine may be transmitted to the wheel 33. Thus, it is possible to cause the vehicle to travel using the output of the power supply device 10 or the engine.

When the vehicle is decelerated or stopped, the motor generator 32 converts kinetic energy, generated at the time of braking the vehicle, to electric energy (alternating-current power). The inverter 31 converts alternating-current power, generated by the motor generator 32, to direct-current power, and supplies the direct-current power to the power supply device 10. Thus, the power supply device 10 is able to store regenerated electric power. In the case of the hybrid vehicle, in addition to regenerated electric power, electric energy may be stored in the power supply device 10 by driving the motor generator 32 with the use of the engine.

A controller 50 executes drive control over the inverter 31 and the motor generator 32 by outputting control signals respectively to the inverter 31 and the motor generator 32. The controller 50 may include a memory (not shown) that stores various pieces of information. The memory may be provided so as to be incorporated in the controller 50 or may be provided outside the controller 50.

The controller 50 may be provided for each of the inverter 31 and the motor generator 32. Another controller for executing voltage detection process of a voltage monitoring unit 20 (described later) may be provided independently of vehicle control. That is, a central control device that governs control over the entire vehicle may control various portions or an individual controller may be provided for each control over a corresponding one of the portions and then the central control device may be individually connected to each controller.

The controller 50 switches each of the system main relays SMR-B, SMR-G between the on state and the off state by outputting a control signal to a corresponding one of the system main relays SMR-B, SMR-G. When the system main relays SMR-B, SMR-G are turned on, the power supply device 10 and the inverter 31 are connected to each other, and the battery system is started up.

The power supply device 10 according to the present embodiment is directly connected to the inverter 31; however, the power supply device 10 is not limited to this configuration. Specifically, a step-up circuit may be arranged in the current path between the power supply device 10 and the inverter 31. Thus, the step-up circuit is able to step up the output voltage of the power supply device 10, and supply the stepped-up electric power to the inverter 31. The step-up circuit is also able to step down the output voltage of the inverter 31, and supply the stepped-down electric power to the power supply device 10.

The power supply device 10 may be charged with the use of an external power supply. The external power supply is a power supply provided separately from the vehicle, outside the vehicle. The external power supply may be, for example, a commercial power supply. When the commercial power supply is used, a charger (not shown) that converts alternating-current power to direct-current power is required. The charger may be provided separately from the vehicle outside the vehicle, and may be added to the battery system shown in FIG. 1.

The battery stack 10A includes a plurality of single cells 11 electrically serially connected to one another. The plurality of single cells 11 are arranged in one direction. The number of the single cells 11 that constitute the battery stack 10A may be set as needed on the basis of, for example, a required power of the power supply device 10. The battery stack 10A may include a plurality of the single cells 11 electrically connected in parallel with one another.

Each of the single cells 11 may be a secondary battery, such as a nickel metal hydride battery and a lithium ion battery. Instead of the secondary battery, an electric double layer capacitor may be used.

Each of the single cells 11 has a battery case in which a power generating element that carries out charging and discharging operations is accommodated inside the battery case. The power generating element has a positive electrode element, a negative electrode element and a separator arranged between the positive electrode element and the negative electrode element. The positive electrode element has a current collector and a positive electrode active material layer formed on the surface of the current collector. The negative electrode element has a current collector and a negative electrode active material layer formed on the surface of the current collector. The separator, the positive electrode active material layer and the negative electrode active material layer contain an electrolytic solution. Instead of the electrolytic solution, a solid electrolyte may be used. The battery stack 10B may be regarded as having the same configuration as the battery stack 10A.

The battery stacks 10A, 10B are serially connected to each other. The positive electrode terminal (first terminal) of the battery stack 10A is connected to the inverter 31 via the system main relay SMR-B. The negative electrode terminal (second terminal) of the battery stack 10A is connected to the positive electrode terminal (first terminal) of the battery stack 10B via a current path (for example, wire harness, or the like) L. In addition, the negative electrode terminal (second terminal) of the battery stack 10B is connected to the inverter 31 via the system main relay SMR-G.

A current interrupter 40 is provided in the current path L that serially connects the battery stacks 10A, 10B. The current interrupter 40 is used to interrupt the current path L between the battery stacks 10A, 10B. The current interrupter 40 is, for example, constituted by a plug and a grip that is inserted into the plug, and is detachably provided in the current path L. In a state where the grip is inserted in the plug, the current path L is placed in a state where current is allowed to flow via the current interrupter 40 (non-interrupted state). In a state where the grip is disconnected (removed) from the plug, the current path L is placed in a physically separated state (interrupted state).

The current interrupter 40 is removed from the current path L at the time of work for assembling a battery stack or at the time of work for replacing a battery stack. Thus, the current interrupter 40 is used to distribute a total voltage of the serially connected battery stacks 10A, 10B and to avoid contact of the entire power supply device 10 with a high voltage. After work for assembling a battery stack or work for replacing a battery stack, electrical connection between the battery stacks 10A, 10B is allowed by inserting (returning) the current interrupter 40 into the current path L.

The voltage monitoring unit 20 detects the voltages of the respective battery stacks 10A, 10B, and outputs the detected results to the controller 50. A current sensor or a temperature sensor may be provided (not shown). The current sensor provided in the current path L of the power supply device 10 detects a charging or discharging current flowing through the power supply device 10, and is able to output the detected result to the controller 50. The temperature sensor provided in the power supply device 10 detects the battery temperature of the power supply device 10, and is able to output the detected result to the controller 50. The current sensor, the temperature sensor, or the like, may be provided individually at each of the battery stacks 10A, 10B.

The controller 50 is configured to calculate the state of charge (SOC) of the power supply device 10 (battery stacks 10A, 10B) on the basis of the detected value of the voltage monitoring unit 20, the current value, and the like. In addition, the controller 50 is able to acquire an input/output electric power of the power supply device 10, and is able to execute charging control or discharging control in response to a vehicle output request.

Figure 2:
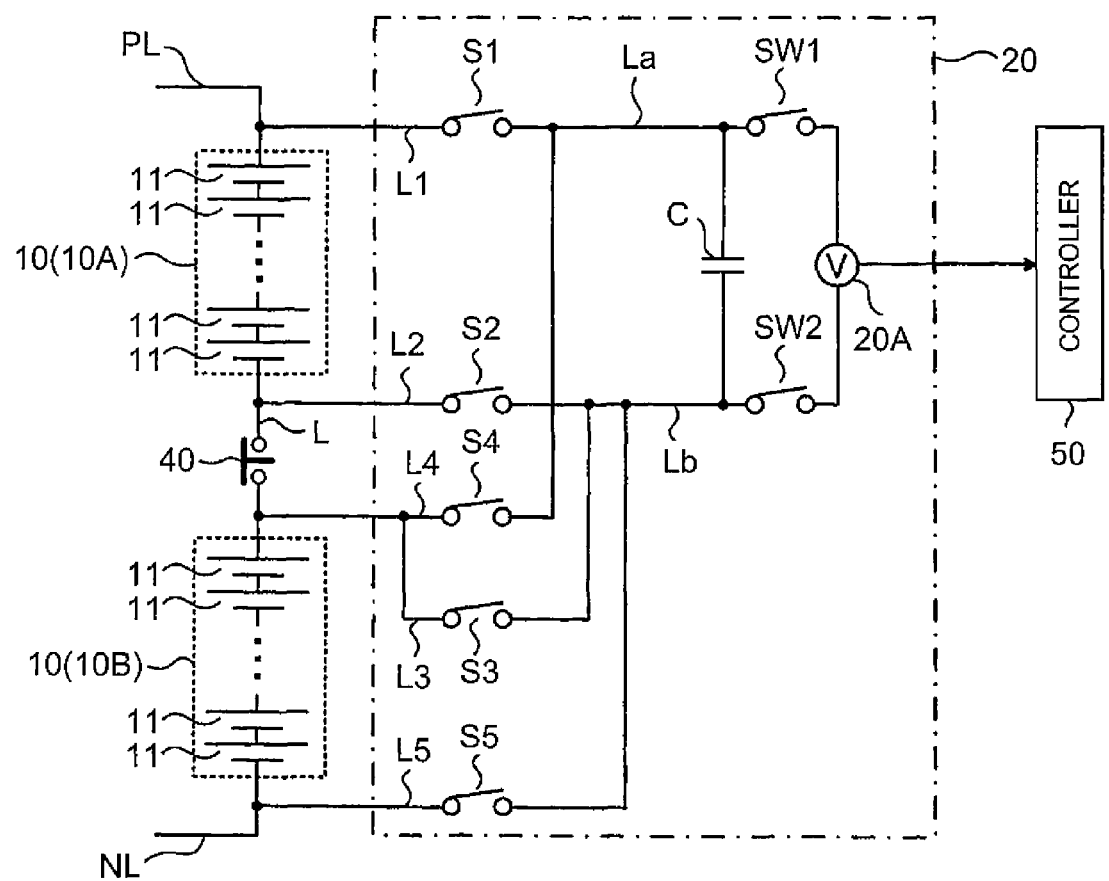
FIG. 2 is a view that shows the schematic configuration of a voltage monitoring unit according to the first embodiment.

FIG. 2 is a schematic configuration of the voltage monitoring unit 20 according to the present embodiment. The voltage monitoring unit 20 according to the present embodiment detects the total voltage of the power supply device 10 and the voltage of each of the battery stacks 10A, 10B that constitute the power supply device 10.

The voltage monitoring unit 20 is configured to include detection lines L1, L2 respectively connected to the positive electrode terminal and negative electrode terminal of the battery stack 10A; detection lines L4, L5 respectively connected to the positive electrode terminal and negative electrode terminal of the battery stack 10B; and a voltage detection circuit 20A. The potentials of both positive and negative electrode terminals of the battery stack 10A are input to the voltage detection circuit 20A via the detection lines L1, L2. Furthermore, the potentials of both positive and negative electrode terminals of the battery stack 10B are input to the voltage detection circuit 20A via the detection lines L4, L5. A detection line L3 will be described later.

One end of the detection line L1 and one end of the detection line L2 are respectively connected to the positive electrode terminal and negative electrode terminal of the battery stack 10A. The other end of the detection line L1 and the other end of the detection line L2 are respectively connected to input lines La, Lb via switches S1, S2. One end of the detection line L4 and one end of the detection line L5 are respectively connected to the positive electrode terminal and negative electrode terminal of the battery stack 10B. The other end of the detection line L4 and the other end of the detection line L5 are respectively connected to the input lines La, Lb via switches S4, S5. A switch S3 will be described later. Each of the switches S1, S2, S4, S5 may be, for example, a photo MOS. Thus, the high-voltage-side battery stacks 10A, 10B are electrically insulated from the low-voltage-side controller 50.

The detection line L4 is connected to the positive electrode terminal of the battery stack 10B. The positive electrode terminal of the battery stack 10B is connected to the negative electrode terminal of the battery stack 10A via the current interrupter 40. In the current path L, the detection line L2 is connected to one side of the current interrupter 40, and the detection line L4 is connected to the other side of the current interrupter 40.

The voltage detection circuit 20A compares the potential input via the detection line L1 with the potential input via the detection line L2, and outputs a potential difference between the positive and negative electrodes as the voltage of the battery stack 10A. In addition, the voltage detection circuit 20A compares the potential input via the detection line L4 with the potential input via the detection line L5, and outputs a potential difference between the positive and negative electrodes as the voltage of the battery stack 10B. The voltage detection circuit 20A may be, for example, constituted by a comparator, and may be configured to include an A/D converter that converts an analog signal potential difference input from the comparator to a digital signal potential difference. The controller 50 is able to acquire the potential difference detected by the comparator via the A/D converter as the voltage of a corresponding one of the battery stacks 10A, 10B.

The voltage detection circuit 20A includes two input units. The input line La connected to the detection line L1 and the detection line L4 is connected to one of the input units, and the input line Lb connected to the detection line L2 and the detection line L5 is connected to the other one of the input units. The voltage detection circuit 20A is connected to both electrodes of the capacitor C (described later) via the respective input lines La, Lb.

In the present embodiment, the capacitor C is connected between the input lines La, Lb. A switch SW1 for turning on or off connection between the input line La and the voltage detection circuit 20A is provided in the input line La, and a switch SW2 for turning on or off connection between the input line Lb and the voltage detection circuit 20A is provided in the input line Lb.

The capacitor C is a capacitor that smoothes a voltage applied between the input lines La, Lb. By connecting two detection lines, corresponding to one of the battery stacks 10A, 10B, to the input lines La, Lb through on/off control over the switches S1, S2, S4, S5, the capacitor C is charged with electric charge based on the potential difference between both positive and negative electrode terminals of the one of the battery stacks 10A, 10B.

In voltage detection according to the present embodiment, the voltage between the input line La and the input line Lb is smoothed by once charging the capacitor C with electric charge, and the voltage of the capacitor C is output to the voltage detection circuit 20A through on/off control over each of the switches SW1, SW2. Thus, the voltage of each of the battery stacks 10A, 10B is detected. The voltage of each of the battery stacks 10A, 10B may be, for example, detected at any timing during start-up of the battery system, at any timing before start-up of the battery system or at any timing after start-up of the battery system.

For example, by turning on the switches S1, S2 and turning off the other switches S4, S5 (including the switch S3 (described later)), the capacitor C is charged with electric charge based on the potential difference between the detection lines L1, L2 (the potential difference between both positive and negative terminals of the battery stack 10A). At this time, the switches SW1, SW2 are in an off state.

After the capacitor C is charged, by turning on the switches SW1, SW2 while turning off all the switches S1 to S5, the voltage of the capacitor C (the voltage of the battery stack 10A) is output to the voltage detection circuit 20A.

Similarly, by turning on the switches S4, S5 and turning off the other switches S1, S2 (including the switch S3 (described later)), the capacitor C is charged with electric charge based on the potential difference between the detection lines L4, L5 (the potential difference between both positive and negative terminals of the battery stack 10B). After the capacitor C is charged, by switching the switches SW1, SW2 from the off state to the on state while placing all the switches S1 to S5 in the off state, the voltage of the capacitor C (the voltage of the battery stack 10B) is output to the voltage detection circuit 20A.

The voltage monitoring unit 20 according to the present embodiment is configured to further include the detection line L3 connected to the current path L at the side of the battery stack 10B. The current path L at the side of the battery stack 10B is connected to the negative electrode terminal (second terminal) of the battery stack 10A via the current interrupter 40.

One end of the detection line L3 (which corresponds to a third detection line) is connected to the input line Lb (capacitor C) via the switch S3. The other end of the detection line L3 is provided between the positive electrode terminal of the battery stack 10B and the switch S4, and is connected to the detection line L4. The detection line L3 may be configured as a branch line branched off from the detection line L4 provided between the positive electrode terminal of the battery stack 10B and the switch S4. The detection line L4 is connected to the input line La. That is, the detection line L4 and the detection line L3 are configured to partially share the detection line and to branch off from the single detection line, connected to the battery stack 10B, into the detection line L4 and the detection line L3.

The detection line L3 is connected to the same electrode as the electrode of the capacitor C, to which the detection line L2 is connected, that is, the input line Lb, and is a detection line paired with the detection line L1 in order to input the potentials of both positive and negative electrode terminals of the battery stack 10A.

The detection line L3 according to the present embodiment, as well as the detection line L4, is a detection line connected to the positive electrode terminal of the battery stack 10B, so, as in the case of the detection line L4, the detection line L2 and the detection line L3 are respectively connected to both sides of the current interrupter 40 in the current path L.

That is, the detection line L3 is a detection line connected to the current path L on the battery stack 10B side of the current interrupter 40. The detection line L3, different from the detection line L4, is connected to the input line Lb. Therefore, the detection line L3 is configured to be paired with the detection line L1 for the voltage detection circuit 20A, and is connected to the negative electrode terminal of the battery stack 10A via the current interrupter 40.

Thus, in voltage detection according to the present embodiment, it is possible to detect the voltage of the battery stack 10A via the current interrupter 40. For example, by turning on the switches S1, S3 and turning off the other switches S2, S4, S5, the capacitor C is charged with electric charge based on the potential difference between the detection lines L1, L3 (the potential difference between both positive and negative electrode terminals of the battery stack 10A). After the capacitor C is charged, by turning off all the switches S1 to S5 and turning on the switches SW1, SW2, the voltage of the capacitor C (the voltage of the battery stack 10A) is output to the voltage detection circuit 20A.

On/off control over the switches S1 to S5 and the switches SW1, SW2 may be executed by the controller 50. Alternatively, a switch control unit (not shown) provided in the voltage monitoring unit 20 may cause the switches S1 to S5 and the switches SW1, SW2 to carry out predetermined switching operations on the basis of control signals from the controller 50.

Next, charging control and discharging control over the power supply device 10 according to the present embodiment will be described. As described above, when the battery system is started up in a state where the current interrupter 40 is not inserted after work for assembling or replacing the battery stacks 10A, 10B, an overvoltage may be applied to the battery stacks 10A, 10B at an interrupted location in the current path L due to removal of the current interrupter 40. Alternatively, when the battery system is started up in the state where the current interrupter 40 is not inserted, an overcurrent may flow into, for example, a device connected to the battery stacks 10A, 10B.

More specifically, when the battery system is started up, the system main relays SMR-B, SMR-G are switched from the off state to the on state, and charging and discharging operations of each of the power supply device 10 are allowed. At this time, the capacitor 34 connected to the inverter 31 is charged with electric charge based on an inverter voltage. The capacitor 34 is connected to the battery stacks 10A, 10B. At the time of the next start-up of the battery system, the capacitor 34 is placed in a state where electric charge is accumulated due to the last start-up of the battery system.

When the system main relays SMR-B, SMR-G are switched from the off state to the on state in a state where the current interrupter 40 is not inserted and electric charge is accumulated in the capacitor 34, the differential voltage between the voltage of the capacitor 34 and the voltage of the battery stack 10A or the battery stack 10B is applied to the interrupted location in the current path L. Thus, an overvoltage is applied to the battery stack 10A or the battery stack 10B.

In the present embodiment, it is determined whether the current interrupter 40 is removed, that is, whether the current interrupter 40 is connected, on the basis of the voltage value detected by the voltage monitoring unit 20. Then, as the result of the determination, control is executed such that charging and discharging operations are not carried out in a state where the current interrupter 40 is removed, thereby the battery stacks 10A, 10B, and the like, are protected from an overvoltage and an overcurrent.

The voltage monitoring unit 20 according to the present embodiment turns on the switch S1 in the detection line L1 and the switch S3 in the detection line L3. Thus, it is possible to detect the voltage of the entire battery stack 10A, including the current interrupter 40, as a detection block. At this time, in a state where the current interrupter 40 is removed, the voltage of the battery stack 10A is not allowed to be detected (is not detected), so it is possible to detect (determine) whether the current interrupter 40 is connected to the current path L.

In the detection result input from the voltage monitoring unit 20, when the voltage value of the battery stack 10A is not detected (for example, when the detected voltage value is 0), the controller 50 is configured not to carry out charging and discharging operations of each of the battery stacks 10A, 10B.

In control in which charging and discharging operations are not carried out, for example, switching of the system main relays SMR-B, SMR-G from the off state to the on state (connecting the inverter 31) may be restricted, and restriction may be applied such that the battery system is not started up.

For example, the voltage monitoring unit 20 detects the voltage of the battery stack 10A via the detection line L1 and the detection line L3 before the controller 50 turns on the system main relays SMR-B, SMR-G when an ignition switch is turned on to start up the battery system. When the controller 50 is not able to detect the voltage of the battery stack 10A on the basis of the detected voltage of the battery stack 10A, the controller 50 restricts switching of the system main relays SMR-B, SMR-G from the off state to the on state, and causes the battery system not to start up. In other words, the controller 50 is able to apply restriction such that the charging and discharging operations of each of the battery stacks 10A, 10B are not carried out.

In this way, according to the present embodiment, through voltage detection of the battery stack 10A via the current interrupter 40, it is possible to detect whether the current interrupter 40 is connected. Then, the controller 50 conducts control where the charging and discharging operations of the power supply device 10 (battery stacks 10A, 10B) are not carried out on the basis of whether the current interrupter 40 is connected. Thus, the charging and discharging operations of the battery system are not allowed in a state where the current interrupter 40 provided in the current path L between the battery stacks 10A, 10B is not inserted, so it is possible to prevent, for example, a decrease in the performance of the battery stacks 10A, 10B.

In the present embodiment, in order to detect the voltage of the battery stack 10A via the current interrupter 40, the single detection line connected to the battery stack 10B is branched into the detection line L4 and the detection line L3. Thus, it is possible to easily add the configuration of detecting whether the current interrupter 40 is connected to the circuit configuration of the voltage monitoring unit 20 that detects the voltages of the battery stacks 10A, 10B. Therefore, it is possible to simplify the voltage monitoring unit 20 and to reduce cost.

Figure 3:
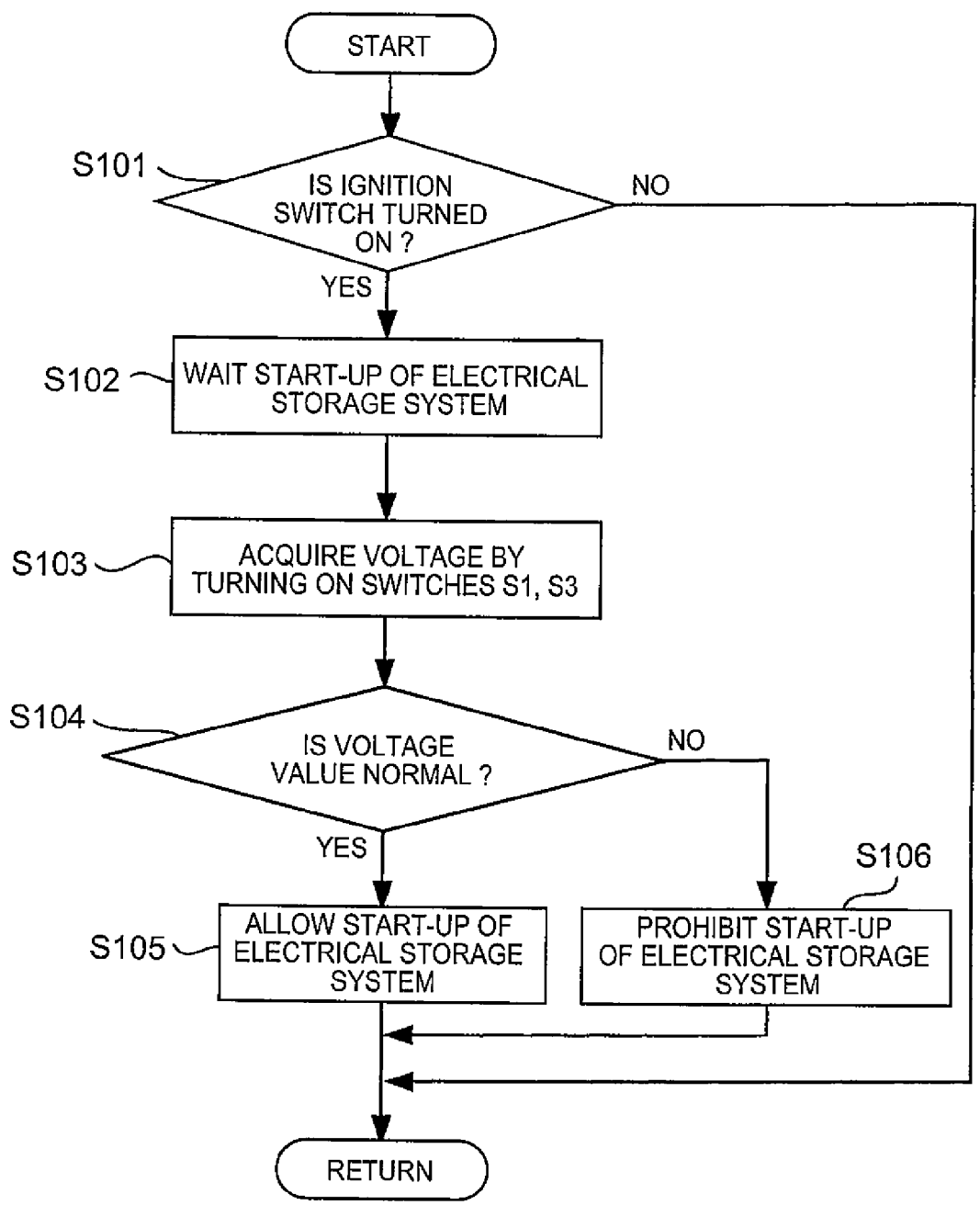
FIG. 3 is a flowchart that shows the process flow of the battery system according to the first embodiment.

FIG. 3 is a view that shows the control flow of the battery system according to the present embodiment.

As shown in FIG. 3, the controller 50 determines in step S101 whether the ignition switch is turned on to start up the battery system. When the ignition switch is turned on (YES in S101), the controller 50 temporarily waits start of the process of starting up the battery system, and issues a command to the voltage monitoring unit 20 such that the voltage monitoring unit 20 executes voltage detection process for determining whether the current interrupter 40 is connected (S102).

As described above, when the ignition switch is turned on, the voltage monitoring unit 20 turns on the switch S1 in the detection line L1 and the switch S3 in the detection line L3. Therefore, the capacitor C is charged with electric charge based on the potential difference between the detection lines L1, L3 (potential difference between both positive and negative electrode terminals of the battery stack 10A). Upon reception of the command from the controller 50, the voltage monitoring unit 20 detects the voltage of the capacitor C, and then outputs the detected voltage to the controller 50 (S103).

The controller 50 determines whether the acquired voltage value is normal in order to determine whether the current interrupter 40 is connected (S104). For example, when the detected voltage value input from the voltage monitoring unit 20 is 0, it may be determined that the detected voltage value is not normal (is abnormal). That is, other than the case where the voltage value is 0 or lower than a predetermined threshold (for example, the open-circuit voltage of the battery stack 10A), it may be determined that the detected voltage value input from the voltage monitoring unit 20 is normal.

As a result of determination in step S104, when the voltage of the battery stack 10A is normal (when the voltage value is not 0), the current interrupter 40 is in an inserted state. Thus, the controller 50 switches the system main relays SMR-B, SMR-G from the off state to the on state, and connects the battery stacks 10A, 10B to the inverter 31, thus starting up the battery system (S105).

On the other hand, when the voltage of the battery stack 10A is not normal, the current interrupter 40 is in a removed state. Thus, the controller 50 does not switch the system main relays SMR-B, SMR-G from the off state to the on state, and prohibits start-up of the battery system (S106). In step S106, when the controller 50 prohibits start-up of the battery system, the controller 50 may execute alarm process, such as lighting an alarm lamp and outputting voice or a message via a display unit.

Other than detection of the voltage of the battery stack 10A via the current interrupter 40, whether the current interrupter 40 is connected may be detected by detecting the voltage of the battery stack 10B via the current interrupter 40. For example, the detection line L3 is branched off from the detection line L2 and is extended, the detection line L2 being connected to the battery stack 10A. Furthermore, the detection line L3 branched off from the detection line L2 is connected to the input line La via the switch S3. With the above configuration, it is possible to detect the voltage of the battery stack 10B via the current interrupter 40 between the detection line L5 and the detection line L3, the detection line L5 being connected to the input line Lb. The capacitor C may be regarded as a first capacitor according to the invention, and the capacitor 34 may be regarded as a second capacitor according to the invention.

What is claimed is:

1. An electrical storage system that supplies electric power to a drive motor for a vehicle, the electrical storage system comprising:
    a first electrical storage stack constituted by a plurality of electrical storage elements;
    a second electrical storage stack constituted by a plurality of electrical storage elements and connected in series with the first electrical storage stack;
    a voltage monitoring unit including a capacitor that is charged by receiving potentials of positive and negative electrodes of each of the electrical storage stacks via detection lines, and a voltage detection unit that is connected to both ends of the capacitor, and detects a voltage value of the capacitor;
    a current interrupter that is detachably provided in a current path connecting the first electrical storage stack and the second electrical storage stack, and interrupts the current path by being removed from the current path; and
    a controller that controls charging and discharging operations of each of the first storage stack and the second electrical storage stack, wherein
    the detection lines include:
        a first detection line having one end connected to a positive electrode terminal of the first electrical storage stack, and the other end connected to one end of the capacitor;
        a second detection line having one end connected to a negative electrode terminal of the first electrical storage stack, and the other end connected to the other end of the capacitor;
        a third detection line having one end connected to a positive electrode terminal of the second electrical storage stack, and the other end connected to the one end of the capacitor;
        a fourth detection line having one end connected to a negative electrode terminal of the second electrical storage stack, and the other end connected to the other end of the capacitor; and
        a fifth detection line having one end connected to the third detection line, and the other end connected to the second detection line, and
    the controller executes control such that the charging and discharging operations of each of the first electrical storage stack and the second electrical storage stack are not carried out, on the voltage value of the capacitor, which is detected via the first detection line and the fifth detection line.

2. The electrical storage system according to claim 1, wherein
    the voltage monitoring unit further includes a plurality of switches respectively provided in the detection lines, and
    the controller is configured to prohibit charging and discharging operations of each of the first and second electrical storage stacks when the voltage of the first electrical storage stack, which is detected at the time when the switch in the first detection line and the switch in the third detection line are turned on, is lower than an open-circuit voltage of the first electrical storage stack.

3. The electrical storage system according to claim 1, wherein
    the controller is configured to prohibit charging and discharging operations of each of the first and second electrical storage stacks on the basis of the voltage of the first electrical storage stack, which is detected via the first detection line and the third detection line.

4. The electrical storage system according to claim 1, further comprising:
    a system main relay configured to allow connection between the drive motor and one of the first electrical storage stack and the second electrical storage stack, wherein
    the controller is configured to restrict switching of the system main relay when the voltage of the first electrical storage stack, which is detected via the first detection line and the third detection line, is not detected.

5. The electrical storage system according to claim 1, further comprising
    a system main relay that allows connection between the first electrical storage stack and the second electrical storage stack, and the drive motor, wherein
    the voltage monitoring unit detects, when an ignition switch of the vehicle is turned on, the voltage value of the capacitor via the first detection line and the fifth detection line before the system main relay is turned on, and
    the controller executes the control such that the charging and discharging operations of each of the first electrical storage stack and the second electrical storage stack are not carried out by restricting switching of the system main relay from an off state to an on state, on the basis of the voltage value of the capacitor, which is detected via the first detection line and the fifth detection line.

6. The electrical storage system according to claim 5, further comprising:
    a second capacitor connected in parallel with the first electrical storage stack and the second electrical storage stack via the system main relay.

7. The electrical storage system according to claim 1, wherein
    the voltage monitoring unit further includes a plurality of switches respectively provided in the detection lines, and
    the controller executes the control such that the charging and discharging operations of each of the first electrical storage stack and the second electrical storage stack are not carried out when the voltage value of the capacitor, detected at the time when the switch in the first detection line and the switch in the fifth detection line are turned on, is 0.

8. The electrical storage system according to claim 7, further comprising a system main relay that allows connection between the first electrical storage stack and the second electrical storage stack, and the drive motor, wherein the voltage monitoring unit detects, when an ignition switch of the vehicle is turned on, the voltage value of the capacitor via the first detection line and the fifth detection line before the system main relay is turned on, and the controller executes the control such that the charging and discharging operations of each of the first electrical storage stack and the second electrical storage stack are not carried out by restricting switching of the system main relay from an off state to an on state, on the basis of the voltage value of the capacitor, which is detected via the first detection line and the fifth detection line.

9. A control method for an electrical storage system that supplies electric power to a drive motor for a vehicle, comprising:

a first electrical storage stack constituted by a plurality of electrical storage elements;

a second electrical storage stack constituted by a plurality of electrical storage elements and connected in series with the first electrical storage stack;

a voltage monitoring unit including a capacitor that is charged by receiving potentials of both positive and negative electrode terminals of each of the electrical storage stacks via detection lines, and a voltage detection unit that is connected to both ends of the capacitor, and detects a voltage value of the capacitor; and a current interrupter that is detachably provided in a current path connecting the first electrical storage stack and the second electrical storage stack, and interrupts the current path by being removed from the current path, wherein the detection lines include:
a first detection line having one end connected to the positive electrode terminal of the first electrical storage stack, and the other end connected to one end of the capacitor;

a second detection line having one end connected to the negative electrode terminal of the first electrical storage stack, and the other end connected to the other end of the capacitor;

a third detection line having one end connected to the positive electrode terminal of the second electrical storage stack, and the other end connected to the one end of the capacitor;

a fourth detection line having one end connected to the negative electrode terminal of the second electrical storage stack, and the other end connected to the other end of the capacitor; and a fifth detection line having one end connected to the third detection line, and the other end connected to the second detection line, the control method characterized by comprising:

a step of detecting the voltage value of the capacitor via the first detection line and the fifth detection line; and a step of executing control such that charging and discharging operations of each of the first electrical storage stack and the second electrical storage stack are not carried out, on the basis of the voltage value of the capacitor.

10. The control method according to claim 9, further comprising:

prohibiting charging and discharging operations of each of the first and second electrical storage stacks when the voltage of the first electrical storage stack, which is detected via the first detection line and the third detection line, is 0.

11. The control method according to claim 9, further comprising:

prohibiting charging and discharging operations of each of the first and second electrical storage stacks when the voltage of the first electrical storage stack, which is detected via the first detection line and the third detection line, is lower than an open circuit voltage of the first electrical storage stack.

* * * * *